US006632277B2

(12) United States Patent
Dietze et al.

(10) Patent No.: US 6,632,277 B2
(45) Date of Patent: Oct. 14, 2003

(54) OPTIMIZED SILICON WAFER GETTERING FOR ADVANCED SEMICONDUCTOR DEVICES

(75) Inventors: Gerald R. Dietze, Portland, OR (US); Sean G. Hanna, Portland, OR (US); Zbigniew J. Radzimski, Brush Prairie, WA (US)

(73) Assignee: SEH America, Inc., Vancouver, WA (US)

( * ) Notice: Subject to any disclaimer, the term of this patent is extended or adjusted under 35 U.S.C. 154(b) by 157 days.

(21) Appl. No.: 09/759,028

(22) Filed: Jan. 11, 2001

(65) Prior Publication Data

US 2001/0015168 A1 Aug. 23, 2001

Related U.S. Application Data

(63) Continuation-in-part of application No. 09/567,659, filed on May 9, 2000, now Pat. No. 6,375,749, which is a continuation-in-part of application No. 09/353,196, filed on Jul. 14, 1999, now abandoned, and a continuation-in-part of application No. 09/353,197, filed on Jul. 14, 1999, now abandoned.

(51) Int. Cl.[7] .............................................. C30B 31/18
(52) U.S. Cl. ............................................. 117/2; 117/19
(58) Field of Search .................................. 117/2, 13, 19

(56) References Cited

U.S. PATENT DOCUMENTS

| 2,842,467 A | 7/1958 | Landauer et al. |
| 4,330,359 A | 5/1982 | Lovelace et al. |
| 4,468,260 A | 8/1984 | Hiramoto |
| 4,533,820 A | 8/1985 | Shimizu |
| 4,540,876 A | 9/1985 | McGinty |
| 4,548,670 A | 10/1985 | Pinkhasov |
| 4,821,674 A | 4/1989 | deBoer et al. |
| 5,002,630 A | 3/1991 | Kermani et al. |
| 5,044,943 A | 9/1991 | Bowman et al. |
| 5,108,792 A | 4/1992 | Anderson et al. |
| 5,156,820 A | 10/1992 | Wong et al. |
| 5,223,081 A | 6/1993 | Doan |
| 5,224,503 A | 7/1993 | Thompson et al. |
| 5,248,378 A | 9/1993 | Oda et al. |
| 5,357,898 A | 10/1994 | Kurosawa et al. |
| 5,421,893 A | 6/1995 | Perlov |
| 5,474,020 A | 12/1995 | Bell et al. |

(List continued on next page.)

FOREIGN PATENT DOCUMENTS

| DE | 10 47 390 B | 12/1958 |
| EP | 0 319 031 A2 | 6/1989 |
| EP | 0 462 741 A2 | 12/1991 |
| GB | 2 198 966 A | 6/1988 |
| JP | 62-275087 A | 11/1987 |

(List continued on next page.)

OTHER PUBLICATIONS

Wolf et al., Silicon Processing for the VLSI Era, vol. 1: Process Technology, Lattice Press, Sunset Beach, CA, USA, pp. 1–72, 124–159, (no month available) 1986.*

(List continued on next page.)

*Primary Examiner*—Benjamin L. Utech
*Assistant Examiner*—Matthew Anderson
(74) *Attorney, Agent, or Firm*—Alston & Bird LLP

(57) ABSTRACT

A method of manufacturing a silicon wafer with robust gettering sites and a low concentration of surface defects is provided. The method comprises adding polycrystalline silicon to a crucible; adding a nitrogen-containing dopant to the crucible; heating the crucible to form a nitrogen-doped silicon melt; pulling a silicon crystal from the melt according to the Czochralski technique; forming a silicon wafer from the silicon crystal, wherein the silicon wafer includes a front surface and a back surface; placing the silicon wafer into a deposition chamber; heating the wafer; and simultaneously depositing an epitaxial first film of a desired compound onto the front surface of the wafer and a second film of the desired compound onto the back surface of the wafer.

12 Claims, 3 Drawing Sheets

U.S. PATENT DOCUMENTS

| | | | |
|---|---|---|---|
| 5,489,341 A | | 2/1996 | Bergman et al. |
| 5,493,987 A | | 2/1996 | McDiarmid et al. |
| 5,500,081 A | | 3/1996 | Bergman |
| 5,584,310 A | | 12/1996 | Bergman et al. |
| 5,723,337 A | | 3/1998 | Muller et al. |
| 5,762,751 A | | 6/1998 | Bleck et al. |
| 5,779,791 A | | 7/1998 | Korb et al. |
| 5,803,977 A | * | 9/1998 | Tepman et al. ............. 118/728 |
| 5,834,363 A | * | 11/1998 | Masanori .................... 438/507 |
| 5,846,073 A | | 12/1998 | Weaver |
| 5,863,843 A | | 1/1999 | Green et al. |
| 5,882,398 A | | 3/1999 | Sonokawa et al. |
| 5,895,596 A | | 4/1999 | Stoddard et al. |
| 5,899,731 A | | 5/1999 | Kai et al. |
| 5,904,478 A | | 5/1999 | Weaver et al. |
| 5,908,292 A | | 6/1999 | Smith et al. |
| 5,911,826 A | | 6/1999 | Hiraishi et al. |
| 5,911,889 A | | 6/1999 | Fabry et al. |
| 5,935,320 A | | 8/1999 | Graef et al. |
| 5,951,775 A | | 9/1999 | Tepman |
| 5,954,873 A | | 9/1999 | Hourai et al. |
| 5,964,953 A | | 10/1999 | Mettifogo |
| 5,972,116 A | | 10/1999 | Takagi |
| 5,976,983 A | | 11/1999 | Miyazaki et al. |
| 5,993,493 A | * | 11/1999 | Takamizawa et al. ...... 29/25.01 |
| 6,001,175 A | * | 12/1999 | Maruyama et al. ......... 117/102 |
| 6,053,982 A | | 4/2000 | Halpin et al. |
| 6,059,875 A | * | 5/2000 | Kirkland et al. .............. 117/13 |
| 6,077,343 A | | 6/2000 | Iida et al. |
| 6,086,680 A | | 7/2000 | Foster et al. |
| 6,228,165 B1 | | 5/2001 | Baba et al. |
| 6,316,361 B1 | * | 11/2001 | Hansson ..................... 548/680 |
| 6,375,749 B1 | * | 4/2002 | Boydston et al. ........... 118/728 |

FOREIGN PATENT DOCUMENTS

| | | |
|---|---|---|
| JP | 04091427 A | 3/1992 |
| WO | WO 86/02919 A1 | 11/1984 |
| WO | WO 99/57344 A1 | 11/1999 |

OTHER PUBLICATIONS

*ASM–Advanced Semiconductor Materials*, Operation and Maintenance, Reactor Section, Nov. 95, p. 7–1.

*Webster's New Collegiate Dictionary*, 1975, G. & C. Merriam Co., p. 887.

*CZ Silicon Crystal Grown in Transverse Magnetic Fields*, K. Hoshi et al., Extended Abstracts, vol. 80–1, 1980, pp. 811–813.

*Controlling the Oxygen Concentration of Silicon Crystals by Magnetically Induced Melt Rotation*, E.M. Hull, IBM Technical Disclosure Bulletin, vol. 23, No. 7A, Dec. 1980.

Semiconductor Silicon Crystal Technology, F. Shimura, Academic Press, Inc., San Diego, CA, 1988, pp. 178–181.

* cited by examiner

OPTIMIZED SILICON WAFER GETTERING FOR ADVANCED SEMICONDUCTOR DEVICES

CROSS-REFERENCE TO RELATED APPLICATIONS

This application is a continuation-in-part of application Ser. No. 09/567,659 for a SUSCEPTORLESS SEMICONDUCTOR WAFER SUPPORT AND REACTOR SYSTEM FOR EPITAXIAL LAYER GROWTH, filed May 9, 2000, and now issued as U.S. Pat. No. 6,375,749, is a continuation-in-part of application Ser. No. 09/353,196 filed Jul. 14, 1999 now abandoned, and application Ser. No. 09/353,197, filed Jul. 14, 1999 now abandoned, the disclosures of which are incorporated by reference herein.

TECHNICAL FIELD

The present invention relates to a method of manufacturing a semiconductor wafer, and more particularly to a method of manufacturing a semiconductor wafer with improved gettering properties and a reduced concentration of surface defects.

BACKGROUND OF THE INVENTION

The fabrication of leading edge integrated circuit devices requires the use of silicon wafers with very low concentrations of mobile contaminants and surface defects. The presence of such contaminants and defects can degrade device performance by causing larger leakage currents and lower breakdown voltages.

Different types of mobile contaminants may be introduced into the silicon wafer during various steps in the wafer manufacturing process. For example, elemental contaminants can be introduced into the silicon lattice during processes such as crystal growing and etching. Some of these contaminants, notably metallic contaminants such as Cu, Ni, Au and Fe, have high mobility in the silicon lattice and can migrate long distances in the silicon wafer when exposed to elevated process temperatures.

Other processes can cause particulate contaminants to be deposited on the surface of the wafer. For example, a wafer holder may chip the edge of the wafer, which can cause silicon particles to be deposited on either the frontside or backside of the wafer. These particles may then migrate across the wafer surface, or onto adjacent wafers in a batch process, possibly contaminating device regions of the wafer.

Various techniques are known for minimizing the potential contamination of device regions of the wafer. For elemental contaminants within the silicon lattice, gettering may be used to immobilize the impurity atoms. Gettering involves the capture of impurity atoms in a silicon wafer by extended defects that are located in regions of the wafer away from device regions. Gettering techniques are generally categorized into two types, extrinsic and intrinsic, depending upon how the gettering defects are created.

Extrinsic gettering generally involves subjecting the backside of a wafer to some sort of process that creates damage or stress in the wafer. The damage or stress creates defects in the silicon lattice that can trap mobile impurities. Commonly used processes for damaging the wafer backside include sandblasting, grooving and abrading the wafer backside. While effective to create stress in the wafer backside, these techniques present several problems. For example, each of these processes involves contacting the wafer backside with a potentially contaminating foreign object. Contaminants deposited on the wafer by the stressing process can then contaminate either the frontside of the wafer or other wafers during a later processing stage. Also, the damage created by these processes may lower the mechanical strength of the wafer. Microcracks and dislocations formed as the wafer tries to relieve the stress created in its backside can make the wafer more prone to warpage during thermal cycles. Furthermore, gettering sites created by these techniques are generally not robust—they may be annealed out of the wafer during thermal cycles, releasing previously immobilized impurities back into the wafer. Finally, the use of these techniques requires adding an additional step to the overall wafer manufacture process, increasing the cost of the process.

Another extrinsic gettering technique involves depositing a film of polycrystalline silicon on the back of the wafer via LPCVD. The grain boundaries and lattice defects in the polycrystalline silicon film act as gettering sites. Applying a polycrystalline silicon film to the backside of a wafer creates more robust extrinsic gettering sites than damaging of the backside of the wafer, as the polycrystalline silicon film is less affected by later thermal cycling than backside damage. However, the use of this technique still requires adding an additional LPCVD step to the wafer manufacturing process, increasing the cost of the overall process.

Intrinsic gettering, on the other hand, involves the intentional precipitation of oxygen present in the silicon lattice to create impurity-trapping defects within the bulk silicon. The oxygen is incorporated into the silicon lattice during the crystal growth process by the degradation of the $SiO_2$ crucible used for the crystal growth. Using various thermal cycling techniques, the oxygen can be made to precipitate in regions close to, yet separated from, device regions of the wafer. The oxygen precipitates cause lattice strain, which in turn creates defects that can trap mobile impurities. Typically, the defects are formed by a three-step thermal cycle. First, a high-temperature step is used to remove oxygen from the surface regions of the wafer, where it can harm circuit performance. Next, a lower temperature step is used to nucleate the oxygen precipitates. Finally, another high-temperature step is used to increase the size of the precipitates to create lattice strain.

Intrinsic gettering offers several advantages over extrinsic gettering. For example, intrinsic gettering may be employed without any additional processing steps besides heating steps. Also, the volume of the bulk wafer as a sink for impurities is much larger than the volume of the damaged area when backside extrinsic gettering is used, thus allowing more impurities to be trapped. However, the necessary thermal cycles increase the cost of the wafer manufacturing process. Furthermore, the thermal processes must be carefully controlled so that the oxygen precipitates do not become too large or too dense, as this can lead to later warping of the wafers. Nitrogen doping of the melt from which a silicon crystal is formed can help cause oxygen precipitates to nucleate during crystal pulling without additional thermal processing, but the size of the precipitates may be difficult to control.

It is generally desirable to provide both intrinsic and extrinsic gettering mechanisms to trap as many mobile contaminants in the wafer as possible. However, because of the extra process steps involved with each technique, the provision of both types of gettering mechanisms may make the overall wafer manufacturing process prohibitively expensive.

Surface defects on a wafer may have similar deleterious effects on circuit performance as those caused by mobile impurities. One common type of surface defect is known as crystal originated particles, or COP. COP result from small octahedral voids that form during the crystal growth process due to the agglomeration of point defects within the silicon lattice. When a wafer surface is cleaned using the SC-1 technique, the voids are exposed as COP. The presence and concentrations of COP on a wafer surface can be measured using optical techniques such as laser scattering tomography, in which the defects scatter incident laser light. The presence of these voids within the bulk silicon of a wafer has some advantages, as oxygen tends to precipitate in the walls of the voids, creating gettering sites within the bulk silicon. However, the voids should not be too large in size, as larger voids tend to degrade circuit performance more than smaller voids. Furthermore, the presence of COP on the surface of the silicon is not desirable, as the COP may degrade circuit performance. COP can be removed from the surface of a silicon wafer by depositing an epitaxial film over the top surface of the wafer, but large COP are difficult and expensive to cover with this method. Thus it would be desirable to have a method of economically manufacturing a silicon wafer that offers robust gettering properties and low concentrations of surface defects.

SUMMARY OF THE INVENTION

The present invention provides a method of manufacturing a silicon wafer. The method comprises adding polycrystalline silicon to a crucible; adding a nitrogen-containing dopant to the crucible; heating the crucible to form a nitrogen-doped silicon melt; pulling a silicon crystal from the melt according to the Czochralski technique; forming a silicon wafer from the silicon crystal, wherein the silicon wafer includes a front surface and a back surface; placing the silicon wafer into a deposition chamber; heating the wafer; and simultaneously depositing an epitaxial first film of a desired compound onto the front surface of the wafer and a second film of the desired compound onto the back surface of the wafer.

DETAILED DESCRIPTION OF THE PREFERRED EMBODIMENTS

Figure 1:
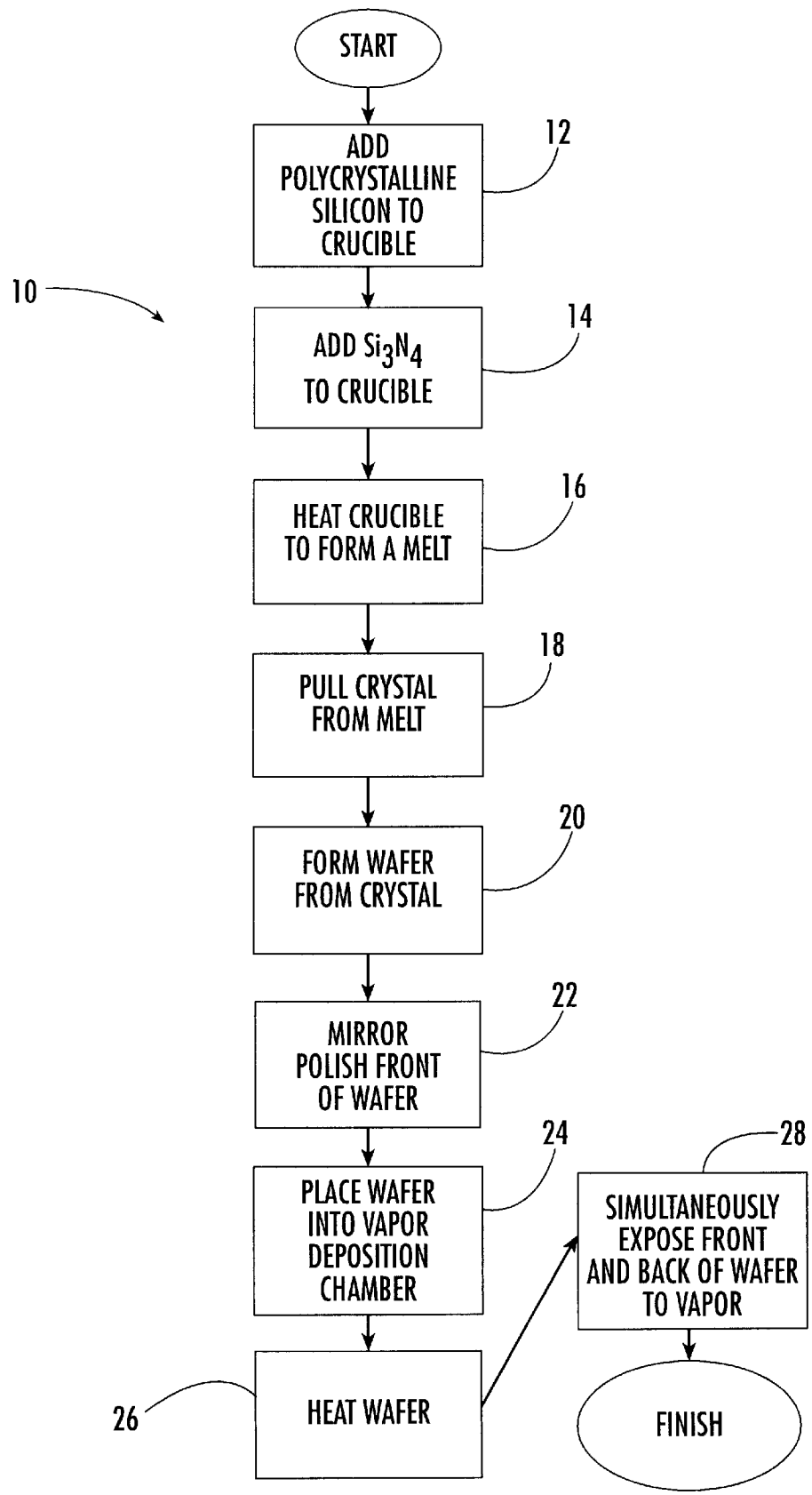
FIG. 1 is a flow diagram showing a method of manufacturing a silicon wafer according to an embodiment of the present invention.

The present invention provides a method of manufacturing a semiconductor wafer with robust gettering characteristics and low concentrations of surface defects that does not prohibitively increase the cost of the wafer manufacturing process. One embodiment of the present invention is illustrated generally at 10 in FIG. 1. Method 10 includes forming a melt from which a silicon crystal may be pulled by first adding polycrystalline silicon to a crucible at 12, then adding a nitrogen-containing dopant, such as silicon nitride ($Si_3N_4$), to the crucible at 14, and then heating the crucible at 16 to form a nitrogen-containing silicon melt. Next, a nitrogen-doped silicon crystal is pulled from the melt at 18 according to the Czochralski technique. After the crystal has been pulled, a wafer is formed from the crystal at 20, and the frontside of the wafer is mirror polished at 22. Next, the wafer is placed into a deposition chamber at 24, and is heated at 26. Finally, when the wafer has reached a desired temperature, reactant gas is flowed simultaneously over the frontside and the backside of the wafer at 28. The conditions in the deposition chamber are set to cause an epitaxial film to grow on the front surface of the wafer. However, because the bottom surface of the wafer is not mirror polished, but is still somewhat rough from the wafer-forming at 20, a polycrystalline film is grown on the bottom of the wafer at the same time the epitaxial film is grown on the front surface.

The nitrogen doping of the crystal and the simultaneous deposition of an epitaxial film on the frontside of the wafer and a polycrystalline film on the backside of the wafer combine synergistically to give the wafer improved gettering characteristics and reduced concentrations of surface defects and contaminants. First, the nitrogen helps to form intrinsic gettering sites during the crystal growing process without having to perform additional thermal cycling. The nitrogen atoms cause oxygen precipitates to nucleate in the growing crystal, and the heat in the crystal causes the precipitates to grow. The growing precipitates create lattice strain which, in turn, causes gettering defects to form. The nitrogen doping also helps to suppress the agglomeration of point defects within the crystal, reducing the size of voids in the crystal and of COP on the surface of a wafer formed from the nitrogen-doped crystal. The reduction of size of the voids is generally accompanied by an increase in the concentration of the voids, which may have the advantage of increasing the concentration of intrinsic gettering sites within the wafer bulk.

The simultaneous deposition of an epitaxial film on the frontside of the wafer and a polycrystalline film on the backside of the wafer has several functions. First, the epitaxial film on the frontside of the wafer covers any COP present on the frontside, improving the surface for device fabrication. Because nitrogen suppresses the size of COP, a thinner layer of epitaxial material can be used to cover COP on the wafer surface than with non-nitrogen doped wafers. Second, the deposition of the polycrystalline film on the backside of the wafer creates extrinsic gettering sites, as the grain boundaries in the polycrystalline material create strain that can trap mobile impurities. Third, the deposition of the polycrystalline film seals any surface impurities present on the backside of the wafer within the first few moments of the process, trapping the impurities and reducing the danger of the impurities from autodoping the wafer frontside. In currently known wafer processes, these processes are often performed in separate steps: the backside polycrystalline layer is deposited via a separate LPCVD step, then an oxide layer is grown to seal the wafer backside, and then the frontside epitaxial layer is deposited via vapor phase epitaxy. In the present invention, the use of a single step to perform all three functions decreases the overall cost of the manufacturing process.

The adding of silicon to the crucible at 12 may be performed in any suitable manner. Generally, electrical grade polycrystalline silicon is added to a fused silica or quartz crucible in either chunk or granular form. If desired, a dopant other than nitrogen may be added to the crucible along with the polycrystalline silicon to form a p or n type crystal. This dopant may be added to the crucible in any desired manner, such as by adding a heavily-doped silicon alloy to the crucible along with the polycrystalline silicon.

Similarly, the adding of a nitrogen-containing dopant to the crucible at 14 may be performed in any desired manner. For example, a nitrogen-containing gas, such as nitrogen gas or nitrous oxide, can be added to the atmosphere within the puller so that nitrogen is dissolved into the melt at the gas-melt interface. Nitrogen can also be added to the melt in solid form. For example, as is known in the art, the inner wall of the crucible can be coated with silicon nitride so that some nitrogen is incorporated into the silicon melt as the walls of the crucible degrade, or silicon nitride-coated wafers may be dissolved into the melt. In the preferred embodiment, silicon nitride is added to the crucible at 14 in powdered form before the crucible is heated to form the melt at 16, as described in U.S. Pat. No. 6,059,875 to Kirkland et al., which is hereby incorporated by reference. In this method, granular silicon nitride is added to the crucible before the crucible is heated so that the nitrogen dissolves into the silicon as the silicon is melted. This method minimizes the number of steps necessary to perform the nitrogen doping, and thus lessens the cost of the overall wafer manufacturing process.

While granular silicon nitride is a preferred nitrogen-containing dopant, other suitable granular nitrogen-containing dopants may also be used. Suitable dopants include those that introduce minimal amounts of other contaminants or dopants into the melt besides the desired quantity of nitrogen.

The granular nitrogen-containing dopant may have any desired average particle size. Generally, the rate of dissolution of the nitrogen-containing dopant into the silicon melt is inversely proportional to the average particle size of the dopant; the larger the average particle size, the slower the dissolution into the melt. This is because the surface area of dopant exposed to the silicon melt relative to the overall mass of dopant added to the crucible decreases with increasing particle size. Thus, to decrease the time necessary to dissolve the dopant, it is preferable to use relatively fine-ground powder. An example of a suitable powder is a powder with an average particle size of 3 mm or less.

The nitrogen-containing dopant is generally added in a sufficient quantity to improve the resistance of the wafer to mechanical damage, yet in a low enough quantity not to alter the conductivity of the wafers appreciably. Generally, the nitrogen-containing dopant is added in a quantity sufficient to give wafers formed from the melt a nitrogen concentration of between $1 \times 10^{10}$ and $5 \times 10^{15}$ nitrogen atoms/cm$^3$, and more preferably between $5 \times 10^{13}$ and $6 \times 10^{14}$ nitrogen atoms/cm$^3$. While these ranges are preferred ranges, it is to be understood that the wafers may have concentrations of nitrogen outside of these ranges as well and still be within the scope of the present invention.

The nitrogen-containing dopant may be added to the melt at any desired time before the pulling of the crystal. Generally, enough time should be allowed for the nitrogen-containing dopant to dissolve completely and mix uniformly into the silicon melt before pulling the crystal. In the depicted embodiment, the nitrogen-containing dopant is added to the crucible before the crucible is heated so that the dopant dissolves into the silicon as the silicon melts. However, it is also possible to add the dopant to the crucible either during the melting process, or after the silicon has been completely melted.

Heating the crucible to form the melt at 16 may be performed in any suitable manner. The heating generally involves first pumping down the pulling chamber, backfilling the chamber with an inert gas and then heating the crucible until the silicon is melted. The crucible is typically supported by a susceptor, and heated by one or more heating elements that are arranged around the susceptor.

Similarly, pulling a nitrogen-doped crystal from the melt at 18 may be performed in any suitable manner in accordance with the Czochralski technique. This technique involves first lowering a seed crystal into the melt to form a solid-liquid interface, and then pulling the seed crystal upward in such a manner that a silicon crystal continually grows at the solid-liquid interface. The crucible and crystal are continuously rotated in opposite directions as the crystal is pulled upward.

The speed at which the nitrogen-doped crystal is pulled affects the agglomeration of point defects that forms COP. As a crystal is being pulled, it is subject to temperatures near the melting point of silicon when it is in the hot zone close to the melt. The agglomeration of defects that form COP occurs at these very high temperatures. The further a portion of the crystal is pulled from the crucible, the more quickly it cools. As the crystal cools, the agglomeration of point defects decreases, decreasing the size of COP. Therefore, the agglomeration of point defects that form COP can be decreased by increasing the pulling rate of the crystal to remove the crystal from the hot zone more quickly. Generally, the growth of smaller voids that occurs with a higher pulling speed is accompanied by a higher concentration of voids.

The crystal may be pulled from the melt at 18 at any desired speed. Because smaller COP may be covered with a thinner and less expensive epitaxial layer, it may be desirable to pull the crystal at a relatively fast speed, such as 1.1 mm/min or greater, to form smaller COP. Additionally, it may be desirable to pull the crystal at a higher speed to decrease the initial size of the precipitates, as the initial size of the precipitates may be correlated to the time the wafer spends in the hot zone. A suitable range of faster pulling speeds to achieve these objectives is between 1.1 and 1.3 mm/min, though pulling speeds outside of this range may also be used.

After the crystal is pulled at 18, a silicon wafer may be formed from the crystal at 20. Forming the silicon wafer generally involves a number of steps. These steps include sawing or otherwise cutting the wafer from the crystal, lapping or grinding the wafer to thin the wafer and to remove damage from the sawing step, shaping the wafer edge, and chemically etching the wafer.

The wafer edge can be given any suitable shape. For example, the edge can be rounded such that it has no sharp corners, or can be beveled. A rounded-edge wafer has superior damage resistance compared to a beveled-edge wafer, as the rounded edge presents no sharp corners that can be chipped or cracked by wafer processing machinery. The use of a rounded edge also helps to further reduce the concentration of impurities or defects on the silicon wafer surface. When a wafer edge is chipped or otherwise damaged, there is a danger that material from the edge of the wafer may contaminate either the frontside or backside of the wafer. By reducing the danger of the edge being chipped, the danger of fragments from a chipped edge contaminating the surface are also reduced.

The rounded edge can be formed in a single grinding step, whereas the beveled edge is generally formed from three separate grinding steps. In an edge-rounding process, the edge of the wafer may be ground with a grinding wheel having a continuously curved, concave grinding surface. The contour of the grinding surface is sized to fit the edge of a wafer, and has the same curvature as that which is to be imparted to the wafer edge. In contrast, in a beveling process, each corner of the wafer edge is ground separately into a flat, angled surface, and then the remaining portion of the wafer edge between the beveled surfaces is ground flat.

After the wafer has been formed at 20, the frontside of the wafer is mirror polished at 22 to prepare the frontside of the wafer for the deposition of the epitaxial film. Typically, the mirror polishing is performed using a chemical-mechanical polishing step well known in the art. This polishing step generally involves applying a slurry of sodium hydroxide and silica particles onto the frontside of the wafer, and then polishing the frontside with a polishing pad. This process gives the wafer a highly polished, scratch- and damage-free frontside.

Once the frontside of the wafer has been mirror polished at 22, the wafer is ready for the simultaneous deposition of the epitaxial film on the frontside of the wafer and the polycrystalline film on the backside of the wafer. The simultaneous deposition process involves several individual steps. First, the wafer is placed into a vapor phase epitaxy deposition chamber at 24, and the chamber is prepared for deposition, e.g. by performing any necessary preliminary steps such as pumping the chamber down. The wafer is supported in the chamber on a special holder, described in more detail below, that allows the frontside and backside of the wafer to be simultaneously exposed to a flow of a reactant gas. After the wafer is positioned on the holder, the wafer is heated at 26 so that atoms of the deposited material can migrate across the wafer surface to form the epitaxial film. Finally, after the wafer is heated, reactant gas is flowed over both the frontside and backside at 28, causing the deposition of the epitaxial frontside film and the polycrystalline backside film.

Figure 2:
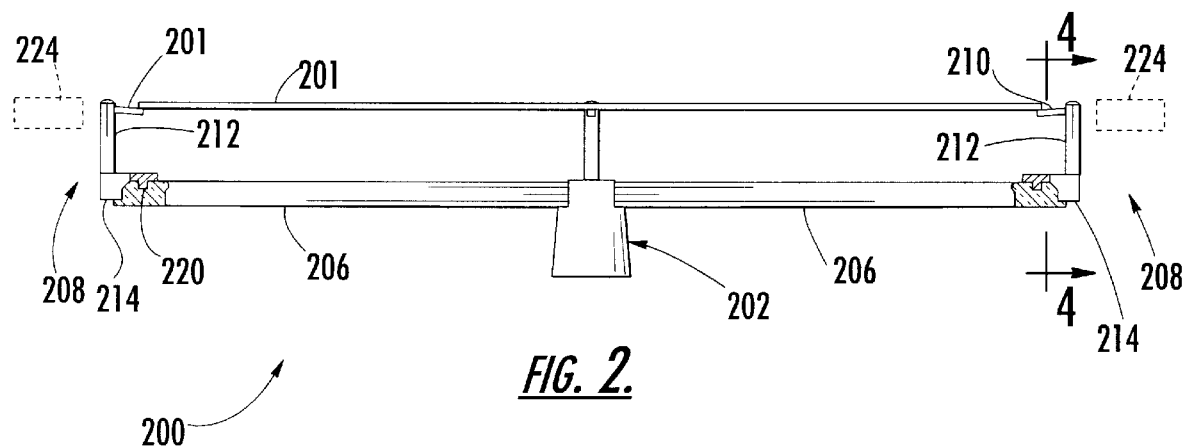
FIG. 2 is a side view of a wafer support for simultaneously depositing an epitaxial film on the wafer frontside and a polycrystalline film on the wafer backside according to the embodiment of FIG. 1.
Figure 3:
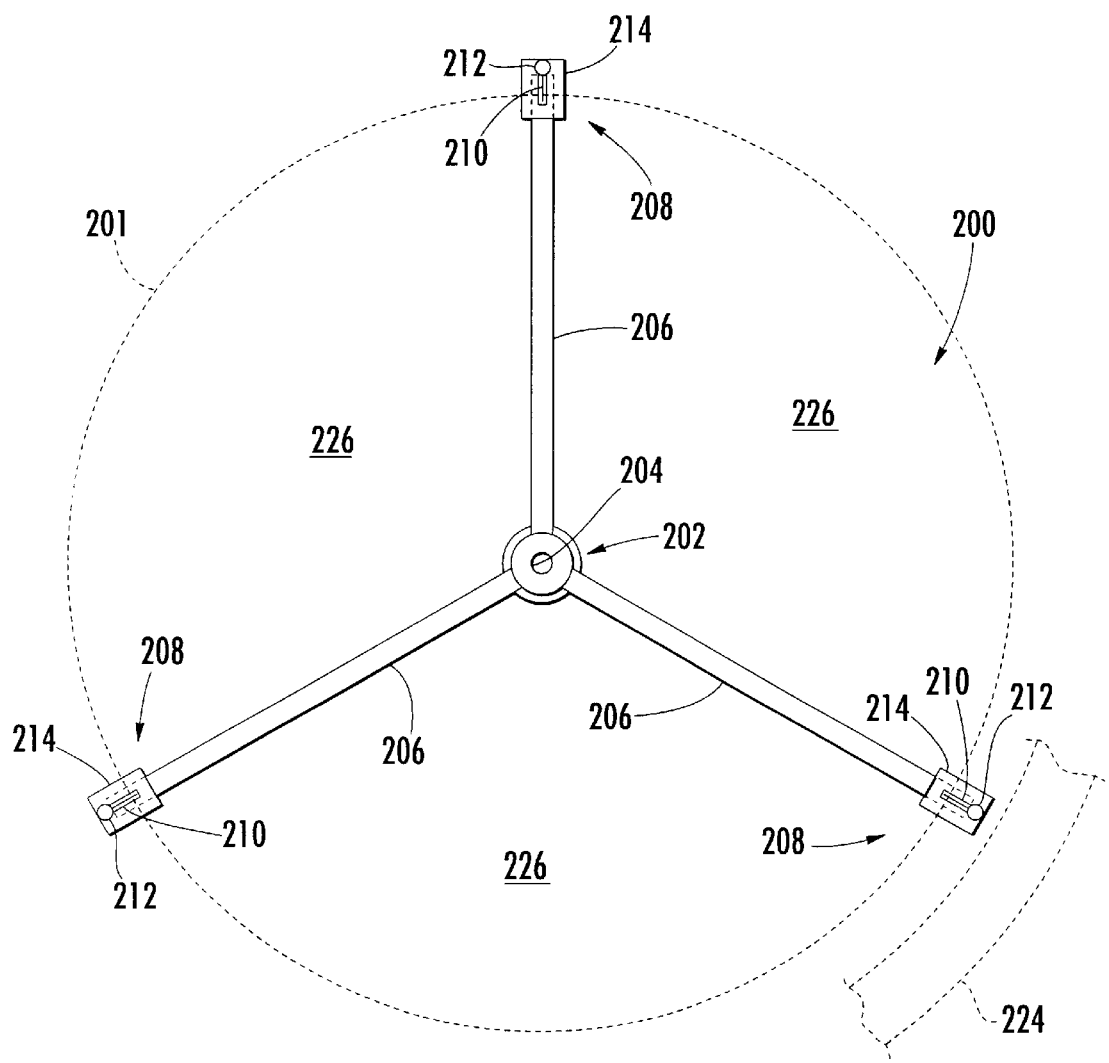
FIG. 3 is a top view of the wafer support of FIG. 2.

FIGS. 2 and 3 show generally at 200 one embodiment of a wafer holder suitable for supporting the wafer in a vapor deposition chamber while simultaneously depositing the epitaxial film on the frontside of a wafer 201 and the polycrystalline film on the backside of wafer 201. Wafer support 200 includes a hub 202 that is flared and configured to mount to a mounting shaft (not shown) in an epitaxial deposition system. The shaft supports and rotates wafer support 202 within the deposition chamber. A hole 204 is provided in the top of hub 202, through which a thermocouple may be fed.

Figure 4:
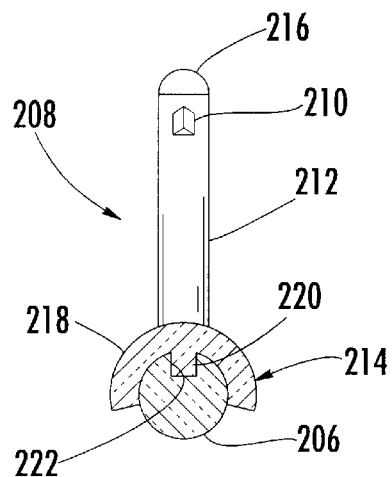
FIG. 4 is a partial cross-sectional view of an arm, coupling member and contact member of the wafer support of FIG. 2.

Wafer support 200 also includes three arms 206 extending radially outward from hub 202. Alternatively, a smaller or greater number of arms may be provided. Arms 206 are typically circular in cross section, as shown in FIG. 4. The top of hub 202 is typically formed horizontally flush with the top of arms 206. Typically, arms 206 extend outward at right angles from hub 202. However, it will be appreciated that arms 206 may extend at another predetermined angle, and/or may curve or spiral outward.

Wafer support 200 includes voids 226 positioned adjacent arms 206. Voids 226 typically extend from backside of wafer 201 to the bottom of the reaction chamber. Voids 226 are configured to facilitate gas flow to the backside of wafer 201. In addition, voids 226 are configured to allow heat energy to radiate from a lower heat energy source positioned below wafer 201 directly to the back side of wafer 201, without being absorbed by an interfering susceptor or wafer support structure. Typically, wafer support 200 is made of quartz, and is substantially thermally transparent, allowing radiant heat energy to pass directly through its structure.

Wafer support 200 further includes a wafer contact assembly 208 coupled to each arm 206 adjacent a distal end of the arm. Each wafer contact assembly 208 includes a contact member 210 mounted to an upwardly extending support member 212, also referred to as post 212, which is in turn mounted to a respective arm 206 by a coupling member 214.

Figure 7:
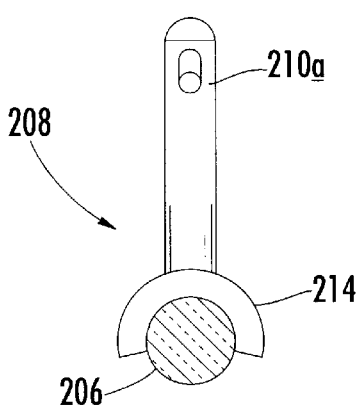
FIG. 7 is a partial cross-sectional view of a second embodiment of a contact member of the wafer support of FIG. 2.

It is desirable to reduce the thermal mass of contact member 210 near wafer 201, in order to reduce thermal interference that may cause abnormalities in the growth of an epitaxial layer on the wafer, such as a heat shadow in the epitaxial layer caused by conductive heat transfer between wafer 201 and contact member 210. Thus, contact member 210 has a shape with minimal surface area near the contact point with wafer 201. Typically, contact member 210 is triangular in shape, as shown in FIG. 4. Alternatively, contact member 210 may be cylindrical in shape, as shown at 210a in FIG. 7, or may be of some other suitable shape. Typically, the contact member is between about 0.02 and 0.20 inches in width, and preferably is about 0.06 inches in width, at its widest point.

Figure 6:
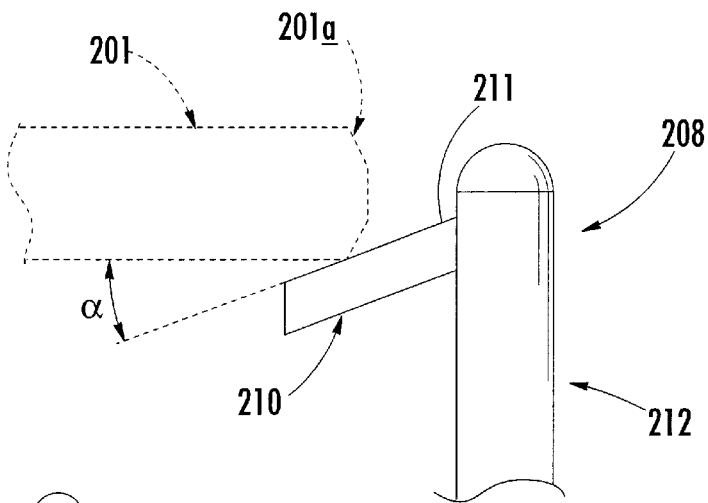
FIG. 6 is a detailed side view of the arm and contact member of the wafer support of FIG. 2.

As shown in FIG. 6, contact member 210 typically extends inwardly and downwardly from post 212. The contact member extends downward from a point above the bottom surface of wafer 201 to a point below the bottom surface. Contact member 210 includes a downwardly sloping top surface portion 211 that is configured to contact an outer edge 201a of wafer 201. The top surface portion 211 of contact member 210 is angled downward at an angle $\alpha$ relative to the horizontal, such that angle a is greater than zero degrees. Thus, contact member 210 contacts the wafer 201 at one point of contact, thereby reducing the thermal interference caused by the wafer support on epitaxial layer growth on the wafer.

Typically, angle $\alpha$ is between about zero and 22 degrees. In one preferred embodiment of the invention, angle $\alpha$ is between zero and 15 degrees. In another preferred embodiment of the invention, angle $\alpha$ is between about zero and 10 degrees, and in a particularly preferred embodiment, angle $\alpha$ is about 4 degrees. It has been found that in these ranges, the wafer tends to center itself upon the three contact members when dropped by a paddle or other loading device onto the contact members 210 of wafer support 200. The wafer vibrates slightly as it hits the contact members, and tends towards a centered position because of the inward slope of the contact members. Thus, successive wafers may be positioned in substantially the same position during the epitaxial growth process, thereby assuring a uniform quality in the epitaxial layers grown on the wafers.

Post 212 typically is mounted to coupling member 214 at a lower end and extends from a point below the bottom surface of wafer 201 to a point above the bottom surface of wafer 201. Post 212 typically includes a rounded top 216, which reduces interference in the gas flow to outer edge 201a of wafer 201. In addition, post 212 is usually circular in cross section. Post 212 is typically positioned outward of the outer edge of the wafer.

Figure 8:
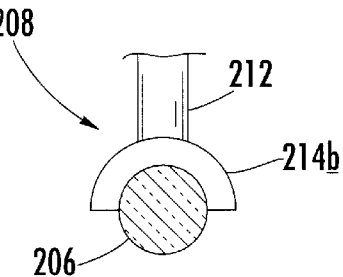
FIG. 8 is a partial cross-sectional view of a third embodiment of the coupling member of the wafer support of FIG. 2.

Coupling member 214 includes a semi-cylindrical member 218 that extends slightly more than 180 degrees around arm 206. The contact assembly is typically quartz. The limited inherent flexibility in this material enables the walls of the semi-cylindrical member 218 to be temporarily bent slightly outward to enable installation of semi-cylindrical member 218 onto arm 206. Alternatively, contact assembly 208 may include a coupling member 214b with a semi-cylindrical member 218 that extends 180 degrees, or less, around arm 206, as shown in FIG. 8.

Figure 5:
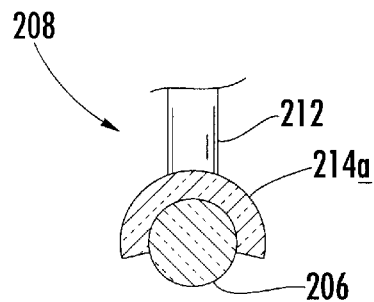
FIG. 5 is a partial cross-sectional view of a second embodiment of the arm and coupling member of the wafer support of FIG. 2.

Coupling member 214 also typically includes a protrusion 220 extending from the semi-cylindrical member 218 into a slot 222 in arm 206. The mating of protrusion 220 and slot 222 serve to secure coupling member 214 on arm 206. Alternatively, the contact assembly may include a coupling member 214a without any protrusion, as shown in FIG. 5. It will be understood that coupling member 214 also may be secured to arm 206 by interference fit, welding or fusing, or other suitable attachment method.

A heat-absorbing ring 224 may also be placed around an outside edge of the wafer 201, adjacent an outer side of each of the wafer contact assemblies 208. Heat-absorbing ring 224 is typically at least as thick as wafer 201. Typically, heat-absorbing ring is made of graphite. Alternatively, another suitable material may be used. Heat-absorbing 224 ring serves to absorb and evenly distribute heat to the edge of wafer 201.

Though the wafer holder depicted in FIGS. 2–8 is a preferred wafer holder, any wafer holder that permits a reactant gas to flow simultaneously over the frontside and the backside of the wafer may also be used to support the wafer in an epitaxial deposition chamber, such as the holders disclosed in the above-referenced U.S. patent application Ser. No. 09/567,659 for a SUSCEPTORLESS SEMICONDUCTOR WAFER SUPPORT AND REACTOR SYSTEM FOR EPITAXIAL LAYER GROWTH, filed May 9, 2000, and now issued as U.S. Pat. No. 6,375,749.

After the wafer is placed in the vapor deposition chamber at 24, the wafer is heated at 26 to a predetermined deposition temperature. Wafer holder 200 offers an additional advantage of the present method over known deposition methods, as wafer holder 200 allows the frontside and backside of a wafer to be directly heated without having to heat a susceptor. Typically, heat energy is radiated directly to the frontside and backside of the wafer. The radiant energy can pass directly through voids 226 in wafer support 200 to the back side of the wafer. Voids 226 in wafer support 200 enable the heat energy source to heat the wafer without substantial structural interference by a susceptor or the wafer support. In addition, voids 226 decrease the thermal mass of wafer support 200. Therefore, compared to prior reactors with susceptors, the present invention enables the wafer to be heated more directly and quickly, further lowering the overall cost of the wafer manufacturing process.

The wafer is heated until it reaches a predetermined process temperature for the simultaneous growth of the epitaxial silicon film on the wafer frontside and the polycrystalline film on the wafer backside. The process temperature typically is between 900 and 1200 degrees Celsius. A thermocouple may be positioned within hole 204 so that it is proximate the wafer to sense the temperature of the reaction chamber adjacent the wafer. To reduce thermal interference with the wafer, the thermocouple typically does not contact the wafer.

After the wafer is heated at 26, a reactant gas is flowed simultaneously over the frontside and backside of the wafer at 28. The gas flows over the backside of the wafer by flowing through voids 226. The smooth surface of the mirror-polished wafer frontside allows an epitaxial film to grow on the frontside. Because the wafer backside is not mirror polished, but rough in comparison to the front side, a polycrystalline film grows on the backside. The reactant gas may be any gas capable of depositing a high-purity epitaxial film of the desired material onto the frontside of the wafer. Typical gases include silane, silicon tetrachloride and others.

Once the epitaxial film and the polycrystalline film have been simultaneously deposited on the front and back surface of the wafer, respectively, any particulate impurities present on the backside of the wafer will be sealed underneath the polycrystalline film. Likewise, the gettering sites within the polycrystalline film combine with those created in the nitrogen-doped crystal growing process to capture mobile impurities within the silicon lattice. Furthermore, the epitaxial frontside film covers defects such as COP in the wafer frontside, forming an extremely uniform surface for the downstream fabrication of devices on the wafer.

INDUSTRIAL APPLICABILITY

The present invention is applicable to the semiconductor processing industry, and more particularly to the manufacture of silicon wafers with robust gettering characteristics and low concentrations of surface defects.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A method of manufacturing a silicon wafer with gettering characteristics, comprising:
   adding polycrystalline silicon to a crucible;
   adding a nitrogen-containing dopant to the crucible;
   heating the crucible to form a nitrogen-doped silicon melt;
   pulling a silicon crystal from the melt according to the Czochralski technique;
   forming a silicon wafer from the silicon crystal, wherein the silicon wafer includes a frontside and a backside;
   polishing the frontside of the silicon wafer such that the frontside of the wafer has less damage than the backside of the wafer;

placing the silicon wafer into a deposition chamber;

heating the wafer; and simultaneously depositing an epitaxial first film of a predefined compound onto the frontside of the wafer and polycrystalline film of the predefined compound onto the backside of the wafer, wherein the simultaneous deposition comprises providing a common flow of gas to both the frontside and the backside of the silicon wafer, and wherein providing the common flow of gas comprises introducing the common flow of gas to both the frontside and the backside of the wafer through a common inlet into the deposition chamber.

2. The method of claim 1, wherein adding a nitrogen-containing dopant to the crucible includes adding silicon nitride powder to the crucible.

3. The method of claim 2, wherein adding silicon nitride powder to the crucible includes adding silicon nitride powder with an average particle size of less than or equal to 3 millimeters to the crucible.

4. The method of claim 1, wherein adding a nitrogen-containing dopant to the crucible includes adding a nitrogen-containing dopant to the crucible before heating the silicon to form a melt.

5. The method of claim 1, wherein adding a nitrogen-containing dopant to the crucible includes adding a nitrogen-containing dopant to the crucible while heating the silicon to form a melt.

6. The method of claim 1, wherein adding a nitrogen-containing dopant to the crucible includes adding a nitrogen-containing dopant to the crucible in a quantity sufficient to give the silicon crystal a nitrogen concentration of between $1 \times 10^{10}$ nitrogen atoms/cm$^3$ and $5 \times 10^{15}$ nitrogen atoms/cm$^3$.

7. The method of claim 6, wherein adding a nitrogen-containing dopant to the crucible in a quantity sufficient to give the silicon crystal a nitrogen concentration of between $1 \times 10^{10}$ nitrogen atoms/cm$^3$ and $5 \times 10^{15}$ nitrogen atoms/cm$^3$ includes adding a nitrogen-containing dopant to the crucible in a quantity sufficient to give the silicon crystal a nitrogen concentration of between $5 \times 10^{13}$ nitrogen atoms/cm$^3$ and $6 \times 10^{14}$ nitrogen atoms/cm$^3$.

8. The method of claim 1, wherein pulling a silicon crystal from the melt includes pulling a silicon crystal from the melt at a pulling rate of between 1.1 and 1.3 mm/min.

9. The method of claim 1, wherein placing the silicon wafer into an epitaxial deposition chamber includes placing the silicon wafer on a wafer support member that includes a void adjacent the backside of the wafer.

10. The method of claim 9, wherein simultaneously depositing an epitaxial first film of a predefined compound and a polycrystalline film of the predefined compound onto the backside of the wafer includes flowing a reactant gas simultaneously over the frontside of the wafer and through the void adjacent the backside of the wafer such that the reactant gas deposits the epitaxial and polycrystalline films.

11. A method of manufacturing a silicon wafer with gettering properties, the wafer including intrinsic gettering properties and extrinsic gettering properties, the method comprising:

adding polycrystalline silicon to a crucible;

adding a nitrogen-containing dopant to the crucible;

heating the crucible to form a nitrogen-doped silicon melt in the crucible;

pulling a nitrogen-doped silicon crystal from the nitrogen-doped silicon melt according to the Czochralski method;

forming a silicon wafer from the nitrogen-doped silicon crystal; and providing a common flow of gas to both a frontside and a backside of the silicon wafer in a deposition chamber to thereby simultaneously deposit an epitaxial film of a predefined compound on the frontside of the wafer and a polycrystalline film of the predefined compound on the backside of the wafer, wherein providing the common flow of gas comprises introducing the common flow of gas to both the frontside and the backside of the wafer through a common inlet into the deposition chamber.

12. The method of claim 11, wherein pulling the nitrogen-doped silicon crystal includes pulling the silicon crystal from the nitrogen-doped silicon melt at a pulling rate of between 1.1 and 1.3 mm/min.

* * * * *